(12) United States Patent
Wilpert

(10) Patent No.: US 10,694,632 B2
(45) Date of Patent: Jun. 23, 2020

(54) SAFETY-RELATED ELECTRONICS MODULE

(71) Applicant: Euchner GmbH + Co. KG, Leinfelden-Echterdingen (DE)

(72) Inventor: Dominik Wilpert, Stuttgart (DE)

(73) Assignee: Euchner GmbH + Co. KG, Leinfelden-Echterdingen (DE)

( * ) Notice: Subject to any disclaimer, the term of this patent is extended or adjusted under 35 U.S.C. 154(b) by 338 days.

(21) Appl. No.: 15/900,819

(22) Filed: Feb. 21, 2018

(65) Prior Publication Data

US 2018/0270974 A1    Sep. 20, 2018

(30) Foreign Application Priority Data

Mar. 17, 2017  (EP) .................................... 17161674

(51) Int. Cl.
*H05K 5/03* (2006.01)
*H01R 13/622* (2006.01)
*H01R 13/6581* (2011.01)
*H01L 25/16* (2006.01)
*H01L 25/18* (2006.01)

(52) U.S. Cl.
CPC .............. *H05K 5/03* (2013.01); *H01R 13/622* (2013.01); *H01R 13/6581* (2013.01); *H01L 25/16* (2013.01); *H01L 25/18* (2013.01)

(58) Field of Classification Search
CPC .... H05K 5/03; H01R 13/6581; H01R 13/622; H01R 13/648; H01R 13/02; H01R 4/56; H01L 25/18; H01L 25/16
USPC ......................................................... 361/642
See application file for complete search history.

(56) References Cited

U.S. PATENT DOCUMENTS

2017/0139158 A1*  5/2017  Coenegracht ........ G02B 6/3825

\* cited by examiner

*Primary Examiner* — Dharti H Patel
(74) *Attorney, Agent, or Firm* — Michael Soderman

(57) ABSTRACT

An electronic safety module with an electrical connection (3). The electrical connection (3) comprises a partial thread (10) that is an integral part of an electrically conductive component providing an electrical shielding.

13 Claims, 3 Drawing Sheets

SAFETY-RELATED ELECTRONICS MODULE

CROSS REFERENCE TO RELATED APPLICATIONS

This application claims the priority of EP 17161674.1 filed on 2017 Mar. 17; this application is incorporated by reference herein in its entirety.

BACKGROUND

The invention concerns an electronic safety module pursuant to the preamble of Claim 1.

Such electronic safety modules generally form units having electric and/or electronic components which are preferably integrated in one housing, and which are used for providing safety-relevant functions in the area of safety technology.

One example of such an electronic safety module is a safety switch which is used, in particular, to guard access to a hazardous area. A safety switch can, for example, be used for locking a safety door acting as an access to a hazardous area. The operation of a hazardous system within the hazardous area will not be released by a safety control system until the safety door has been locked by means of the safety switch. The safety switch is connected to the safety control system directly or via an interface module as another electronic safety module.

SUMMARY

The invention concerns an electronic safety module with an electrical connection (3). The electrical connection (3) comprises a partial thread (10) that is an integral part of an electrically conductive component providing an electrical shielding.

DETAILED DESCRIPTION

The invention is based on the problem of improving the connection technology of an electronic safety module of the aforementioned type.

For resolving this problem, the features in Claim 1 have been provided. Advantageous embodiments and useful further developments of the invention are described in the dependent claims.

The invention concerns an electronic safety module with an electrical connection. The electrical connection comprises a partial thread that is an integral part of an electrically conductive component forming an electrical shield.

The electronic safety module pursuant to the invention generally is a unit having electrical and/or electronic components, and safety-relevant functions are realized by this electronic safety module. In particular, the electronic safety module can be embodied by a safety switch. Furthermore, the electronic safety module can be embodied by an interface module by means of which one or several safety switches can be connected to a higher-level unit such as a safety control unit.

Pursuant to the invention, the electronic safety module has an electrical connection having a partial thread. An electrical connection element to be connected to the electrical connection has a thread matching the partial thread, which matching thread can be screwed onto the partial thread.

The partial thread provided pursuant to the invention, which is preferably embodied as an internal thread, has significant advantages over full threads with regard to manufacturing technology. Such full threads are typically produced by means of finish-boring during the casting process, which requires costly casting tools. In addition, full threads can be produced by tapping, which is also costly.

In contrast to this, a partial thread can be produced efficiently by casting it as part of the component. Thus, the production of a partial thread can be integrated into the casting process for the component without major additional expense.

Here, the component comprising the partial thread consists of an electrically conductive, in particular a metallic material. This component forms a cast part, e.g. a zinc diecast part. During the casting process for manufacturing the component, the partial thread can be integrally cast with the component, so that no additional separate production steps are necessary for manufacturing the component.

An essential advantage consists of the fact that, due to the electrical conductivity of the component, it can take on the function of providing electrical shielding so that no separate parts for the electrical shielding of the partial thread, and thus of the electrical connection, are necessary.

Pursuant to a particularly advantageous embodiment of the invention, the partial thread extends over a partial angle range of 360°. Within the remaining angle range left out by the partial thread, a partial circle segment arranged concentrically with the partial thread is provided.

As the partial thread does not extend across the full angle range of 360°, but instead only over a partial angle range thereof, when the threaded connection is made between the partial thread of the electrical connection of the electronic safety module and the thread of the electrical connection element, there may potentially be insufficient contact between thread and partial thread. Because, due to this, the thread can move uncontrollably relative to the partial thread, screwing the thread onto the partial thread may be made more difficult, or in an extreme case, may not be possible at all. This potential functional impairment is prevented in a simple manner by the partial circle segment that, together with the partial thread, can guide the thread securely.

In the case of a partial thread embodied as an internal thread, the partial thread forms the first part of an annular structure, which is complemented by the partial circle element as another annular structure. Generally, only the inside of the partial thread will have a threaded structure, but not the partial circle segment, which serves merely as a counterbearing and guiding element.

The partial circle segment can, in principle, extend over the entire remaining angle range not covered by the partial thread. In the case of a partial thread embodied as an internal thread, the partial thread then forms a complete annular structure with the partial circle segment, into which annular structure an external thread of an electrical connection element can be screwed. In order to guarantee that the external thread is guided securely, the partial circle segment must, however, not extend over the entire remaining angle range. In such a case, small gaps remain between the partial thread and the partial circle segment; they are, however, non-critical for proper guiding of the external thread, or of the thread in general.

Pursuant to an advantageous embodiment, the partial thread extends over a partial angle range of smaller than or equal to 180°.

This results in another manufacturing advantage in that the integral casting of the partial thread with the component can be performed without additional devices in the die, such as slide gates. This simplification of the casting tool further also results from the fact that the partial thread is oriented orthogonally to the main demolding direction. The cast part, consisting of the component with the partial thread, can then be manufactured without any mechanical reworking and thus solely by means of a casting process.

Pursuant to an advantageous design-related embodiment of the invention, the housing consists of a base plate and a housing cover. The housing is then simply assembled by merely having to position the housing cover on, and attach it to, the base plate after the latter, in particular, has been equipped with electrical and electronic components.

In this embodiment, the component with the internal thread is an integral part of the base plate. This unit can be produced in a single casting process.

The partial circular segment is then advantageously an integral part of the housing cover, with this partial circular segment advantageously being integrally cast with an element of the housing element. Thus, the housing cover with the partial circular segment can also be efficiently manufactured in a single casting process. In this case, the housing cover can generally consist of a metallic material or also of plastic.

The electrical connection of the electronic safety module can be embodied in different configurations. In particular, the electrical connection can be embodied as a plug or a bushing, with the electrical connection element then being embodied complementarily thereto as a bushing or a plug.

BRIEF DESCRIPTION OF THE DRAWINGS

The invention is explained below based on the drawings. The following is shown.

DETAILED DESCRIPTION OF THE PREFERRED EMBODIMENTS

Figure 1:
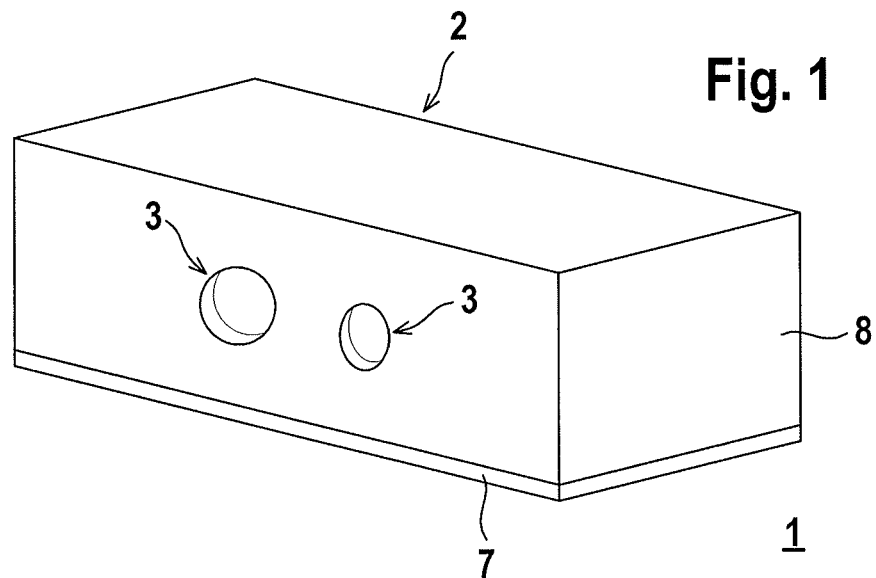
FIG. 1: External view of an interface module as an exemplary embodiment of the electronic safety module according to the invention.
Figure 2:
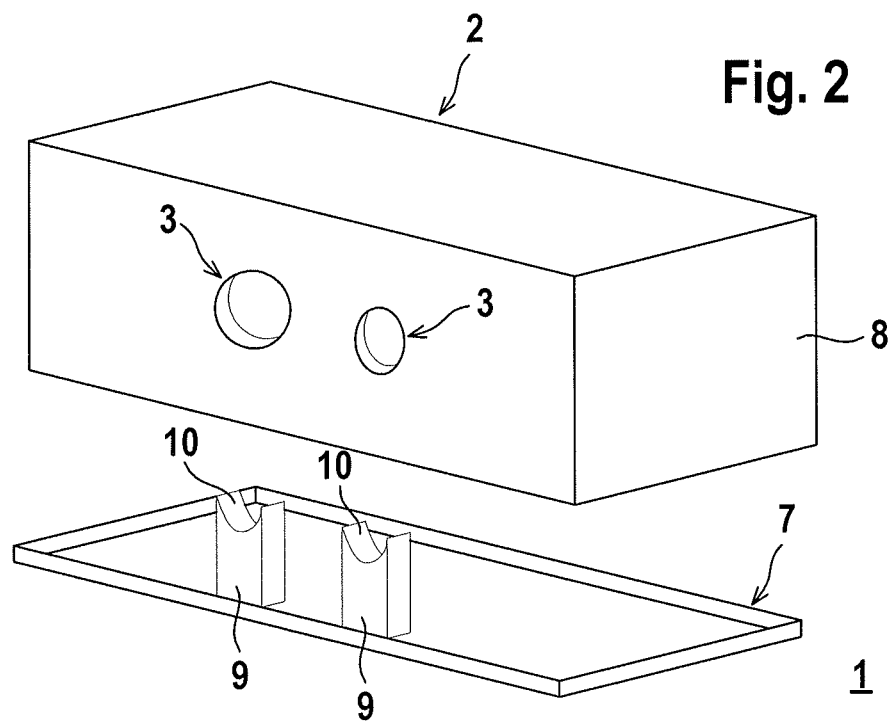
FIG. 2: Interface module pursuant to FIG. 1 with the housing cover removed from a base plate.
Figure 3:
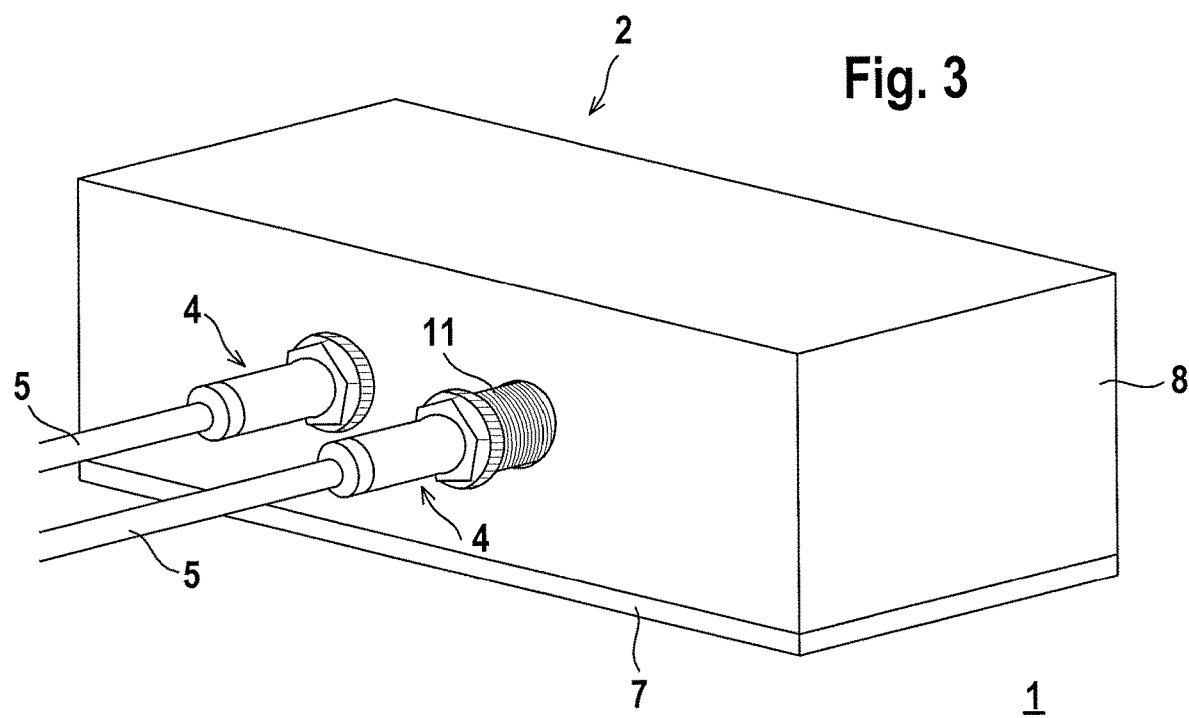
FIG. 3: Interface module pursuant to FIG. 1 with two electrical connections connected to it.

FIGS. 1-3 show an interface module 1 as an exemplary embodiment of the electronic safety module according to the invention. The interface module 1 fulfills a safety function in such a manner that a safety switch or several safety switches can be connected to a higher-order unit such as a safety control unit via this interface module 1. The safety switch(es) as well as the safety control unit are not shown in FIGS. 1-3. The interface module 1 fulfills a translation function in such a manner that data protocols of the safety switch or safety switches are adapted to data protocols of the safety control unit. For this purpose, corresponding electronic and/or electrical components are integrated in housing 2 of the electronic safety module.

Deviating from the exemplary embodiment of FIGS. 1-3, the electronic safety module pursuant to the invention can also be embodied by a safety switch.

Two electrical connections 3 terminate on a wall of housing 2 of the interface module 1. Generally, a different number of electrical connections 3 can also be provided for. As FIG. 3 shows, an electrical connection element 4 can be connected to each of the electrical connections 3, with a cable 5 ending at each electrical connection 3. The cable 5 of an electrical connection element 4 leads to a safety switch. The cable 5 of the other electrical connection element 4 leads to the safety control unit.

Figure 4:
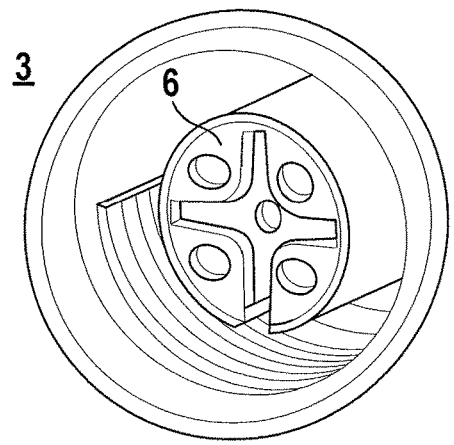
FIG. 4: Individual representation of an electrical connection of the interface module pursuant to FIG. 1.

In the present case, each electrical connection 3 of the interface module 1 is embodied as a bushing. In a detail representation, FIG. 4 shows an electrical connection 3 thusly embodied, with an internal contact socket 6. Correspondingly, the electrical connection elements 4 are embodied as plugs.

Alternatively, the electrical connections 3 can be embodied as plugs, and the electrical connection elements 4 can be embodied as bushings.

The housing 2 consists of a base plate 7 and a housing cover 8. For assembling the interface module 1, the housing cover 8 is positioned on, and attached to, base plate 7 after base plate 7 has been equipped with electrical or electronic components. For this purpose, on the base plate 7 and the housing cover 8, suitable means of fastening such as snap-lock means, screw connections, and the like are provided. The individual components and the individual means of fastening are not shown in the Figures.

FIG. 1 shows the safety switch in the finished, assembled state in which the housing cover 8 is positioned on, and attached to, base plate 7. FIG. 2 shows the interface module 1 with the housing cover 8 removed from the base plate 7.

Base plate 7 consists of a cast part, said cast part consisting of an electrically conductive material. Advantageously, the base plate 7 consists of a zinc diecast part.

The housing cover 8 also consists of a cast part. The housing cover 8 can consist of a metallic material or plastic.

As can be seen from FIG. 2, on the upper side of the base plate 7, two identically embodied components protrude in the shape of supports 9. Each support 9 has a cuboid contour, with the supports 9 being oriented perpendicular to the flat upper side of base plate 7.

At the upper edge of each support 9 there is a partial thread 10, which in the present case is embodied as an internal thread.

The supports 9 with the partial threads 10 are embodied as one piece with the base plate 7 and are produced as a cast part in one casting process. Because each partial thread 10, as shown in FIG. 2, does not extend over the entire angle range of 360°, but instead only over a partial angle range of 180° (or less), and because each partial thread 10 is oriented orthogonally to the main demolding direction of the casting tool used for producing the cast part, no additional production devices such as slide gates need to be provided in the casting tool. In addition, the base plate 7 can be manufactured as a cast part with supports 9 and partial threads 10 without any mechanical reworking on the cast part being necessary.

Each partial thread 10 is an integral part of the corresponding electrical connection 3 of the interface module 1.

As the partial thread 10 is an integral part of the support 9 that consists of conductive material, this provides electrical shielding of the electrical connection 3 without additional components being required for this purpose.

Each partial thread 10 of an electrical connection 3 is used for fastening an electrical connection element 4 that is to be connected to the electrical connection 3. The electrical connection element 4 has an external thread 11 that corresponds to partial thread 10.

For fastening the electrical connection element 4 to the electrical connection 3, the external thread 11 of the electrical connection element 4 is screwed onto the partial thread 10.

As the partial thread 10 extends only over a partial angle range of 180°, there would be a risk that the external thread 11 would come loose from partial thread 10, thus impairing the screwing-on process.

Figure 5A:
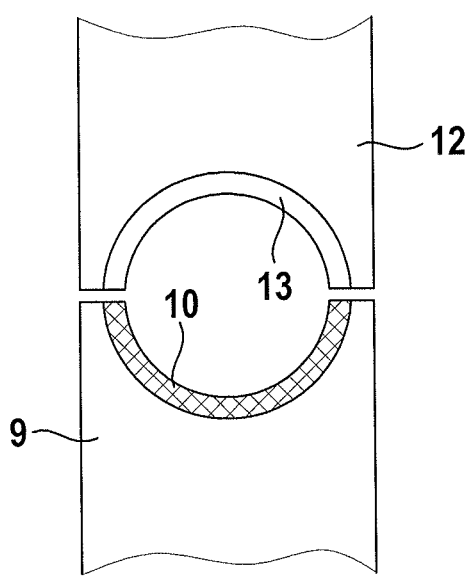
FIG. 5A: First example of a partial thread with an associated partial circular segment for the interface module pursuant to FIG. 1 in a top view.
Figure 5B:
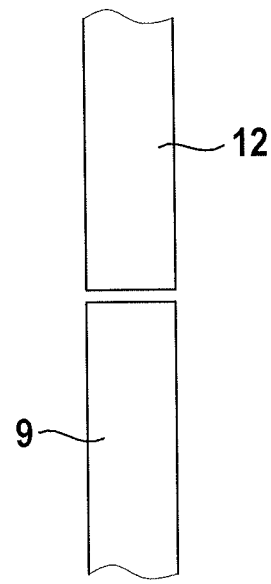
FIG. 5B: First example of a partial thread with an associated partial circular segment for the interface module pursuant to FIG. 1 in a side view.

In order to prevent this, the design shown in the FIGS. 5a, 5b is provided. This design is provided identically for both electrical connections 3 of the interface module 1.

FIG. 5a shows a top view of a support 9 with a partial thread 10 arranged at the upper edge of the support 9 and extending over the partial angle range of 180°. The support with the partial thread 10 is associated with an element 12 of the housing cover 8. This element 12 is embodied in one piece with the rest of the housing cover 8, i.e. the housing cover 8 with the two elements 12 is embodied as one cast part.

At the lower edge of the element 12, a partial circular segment 13 is provided. The partial circular segment 13 forms an annular segment extending over a remaining angle range of 180°.

The lateral surface of the partial circular segment 13 is smooth in design, i.e. it does not incorporate any thread.

During the casting process for producing the housing cover 8, the partial circular segment 13 is integrally cast with element 12, i.e. the production of the partial circular segment 13 is performed in the actual casting process. Thus, no separate manufacturing steps are necessary for producing the partial circular segment 13.

FIGS. 5a, 5b show the support 9 and the associated element 12 of the housing cover 8 when the housing cover 8 is positioned on, and attached to, base plate 7.

As FIG. 5a shows, the element 12 is located with the partial circular segment 13 closely above support 9 with the partial thread 10, so that the partial thread 10 and the partial circular segment 13 that is arranged concentrically with partial thread 10 complement each other to form a closed ring. This is achieved by adapting the partial circular segment 13 to the partial thread 10 in such a manner that the partial thread 10 extends over the partial angle range of 180° and the partial circular segment 13 extends completely over the remaining angle range, which is also 180°, left free by the partial thread 10.

The inner diameter of the ring formed by the partial circular segment 13 and by the partial thread 10 is adapted to the outer diameter of the external thread so that the external thread is guided with low backlash into this ring.

As FIG. 5b shows, when the housing cover 8 is positioned on base plate 7, the support 9 and the element 12 are arranged above each other. This forms a hollow cylindrical receptacle for the external thread 11 of the electrical connection element 4.

By means of this structure, the external thread 11 can be tightly screwed onto partial thread 10 without any risk that the external thread 11 will come loose from partial thread 10 while being screwed on, because partial circular segment 13 acts as a counterbearing.

Figure 6A:
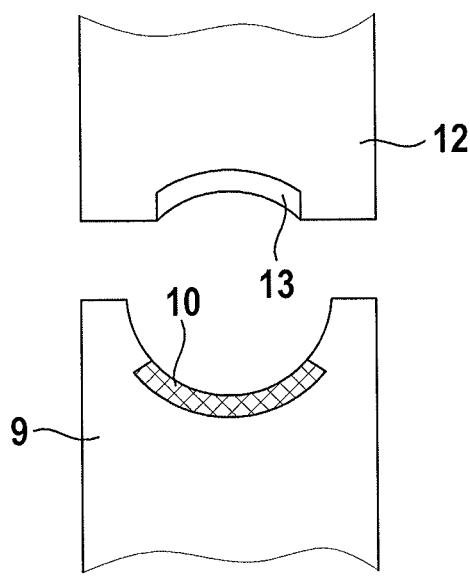
FIG. 6A: Second example of a partial thread with an associated partial circular segment for the interface module pursuant to FIG. 1 in a top view.
Figure 6B:
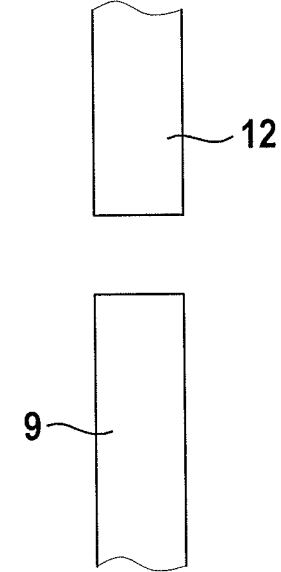
FIG. 6B: Second example of a partial thread with an associated partial circular segment for the interface module pursuant to FIG. 1 in a side view.

FIGS. 6a, 6b show a variant of the design from FIGS. 5a, 5b. The design from FIGS. 6a, 6b differs from the embodiment of FIGS. 5a, 5b only in that the partial circular segment 13 no longer extends over the entire remaining angle range left free by partial thread 10, but instead only over a partial range thereof. Correspondingly, the partial thread 10 and the partial circular segment 13 no longer complement each other to form a completely closed ring.

Instead, gaps now remain between the partial circular segment 13 and the partial thread 10. These gaps are, however, non-critical for controlled guiding of the external thread 11, as the partial circular segment 13 is arranged diametrically opposite the partial thread 10, thus forming a counterbearing that holds the external thread 11 engaged with partial thread 10 while being screwed on.

LIST OF REFERENCE NUMERALS (1) Interface module
(2) Housing
(3) Electrical connection
(4) Electrical connection element
(5) Cable
(6) Contact socket
(7) Base plate
(8) Housing cover
(9) Support
(10) Partial thread
(11) External thread
(12) Element
(13) Partial circular segment

The invention claimed is:

1. Electronic safety module with an electrical connection (3), characterized in that the electrical connection (3) comprises a partial thread (10) that is an integral part of an electrically conductive component providing electrical shielding, wherein the component embodying the partial thread (10) consists of an electrically conductive material.

2. Electronic safety module pursuant to claim 1, characterized in that the partial thread (10) is an internal thread.

3. Electronic safety module pursuant to claim 1, characterized in that the partial thread (10) extends over a partial angle range of 360° and that, running within the remaining angle range left free by the partial thread (10), there is provided a partial circular segment (13) that is arranged concentrically to the partial thread (10).

4. Electronic safety module pursuant to claim 3, characterized in that the partial circular segment (13) extends over the entire remaining angle range or a part thereof.

5. Electronic safety module pursuant to claim 3, characterized in that the partial angle range is smaller than or equal to 180°.

6. Electronic safety module pursuant to claim 1, characterized in that the component embodying the partial thread (10) is an integral part of a base plate (7) of a housing (2).

7. Electronic safety module pursuant to claim 1, characterized in that partial thread (10) is integrally cast with the component.

8. Electronic safety module pursuant to claim 1, characterized in that the partial circular segment (13) is an integral part of the housing cover (8).

9. Electronic safety module pursuant to claim 8, characterized in that the partial circular segment (13) is integrally cast with an element (12) of the housing cover (8).

10. Electronic safety module pursuant to claim 1, characterized in that an electrical connection element (4) can be connected to its electrical connection (3), with the electrical connection element (4) having a thread that can be screwed onto the partial thread (10).

11. Electronic safety module pursuant to claim 10, characterized in that the electrical connection (3) is embodied as a plug or a bushing, and that complementarily thereto, the electrical connection element (4) is embodied as a bushing or a plug.

12. Electronic safety module pursuant to claim 1, characterized in that it is a safety switch.

13. Electronic safety module pursuant to claim 1, characterized in that it is an interface module (1).

\* \* \* \* \*